(12) United States Patent
Oomori

(10) Patent No.: US 10,916,531 B2
(45) Date of Patent: Feb. 9, 2021

(54) SEMICONDUCTOR MODULE

(71) Applicant: SUMITOMO ELECTRIC INDUSTRIES, LTD., Osaka (JP)

(72) Inventor: Hirotaka Oomori, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 43 days.

(21) Appl. No.: 16/349,397

(22) PCT Filed: Aug. 7, 2017

(86) PCT No.: PCT/JP2017/028626
§ 371 (c)(1),
(2) Date: May 13, 2019

(87) PCT Pub. No.: WO2018/096734
PCT Pub. Date: May 31, 2018

(65) Prior Publication Data
US 2019/0371773 A1    Dec. 5, 2019

(30) Foreign Application Priority Data

Nov. 24, 2016 (JP) ................................ 2016-227744

(51) Int. Cl.
*H01L 25/16* (2006.01)
*H01L 29/78* (2006.01)
(Continued)

(52) U.S. Cl.
CPC .......... *H01L 25/16* (2013.01); *H01L 23/3736* (2013.01); *H01L 23/492* (2013.01);
(Continued)

(58) Field of Classification Search
CPC .................. H01L 23/62; H01L 25/072; H01L 21/823487; H01L 29/66666;
(Continued)

(56) References Cited

U.S. PATENT DOCUMENTS 10,541,208 B2 * 1/2020 Oomori ................. H01L 25/072

FOREIGN PATENT DOCUMENTS

| JP | 2011-036016 | 2/2011 |
| JP | 2014-187874 | 10/2014 |

(Continued)

*Primary Examiner* — Thanh Y. Tran
(74) *Attorney, Agent, or Firm* — IPUSA, PLLC

(57) ABSTRACT

A semiconductor module according to an embodiment includes a circuit substrate, a first vertical transistor having a first main electrode pad facing and coupled to a first input interconnect pattern of the circuit substrate, and having a first gate electrode pad coupled to a first control interconnect pattern of the circuit substrate, a second vertical transistor having a fourth main electrode pad facing and coupled to a second input interconnect pattern of the circuit substrate, and having a second gate electrode pad facing and coupled to a second control interconnect pattern of the circuit substrate, a surge voltage absorbing device connecting the first and second input interconnect patterns to absorb surge voltage, and a plate member connecting a second main electrode pad of the first vertical transistor and a third main electrode pad of the second vertical transistor.

16 Claims, 6 Drawing Sheets

(51) Int. Cl.
 *H01L 23/373* (2006.01)
 *H01L 23/492* (2006.01)
 *H01L 23/538* (2006.01)
 *H01L 23/62* (2006.01)

(52) U.S. Cl.
 CPC .......... *H01L 23/5386* (2013.01); *H01L 23/62* (2013.01); *H01L 29/7827* (2013.01)

(58) Field of Classification Search
 CPC .................. H01L 29/66712–66734; H01L 29/7802–7815; H01L 29/7827–7828; H01L 29/78642; H01L 51/057; H01L 23/492; H01L 23/5386; H01L 25/16
 See application file for complete search history.

(56) References Cited

FOREIGN PATENT DOCUMENTS

| | | |
|---|---|---|
| JP | 2015-135895 | 7/2015 |
| JP | 2016-026466 | 2/2016 |

\* cited by examiner

SEMICONDUCTOR MODULE

TECHNICAL FIELD

The disclosures herein relate to a semiconductor module.

The present application claims priority based on Japanese application No. 2016-227744 filed on Nov. 24, 2016, the entire contents of which are hereby incorporated by reference.

BACKGROUND ART

It is known that in a semiconductor module having a power conversion circuit, such as an inverter circuit, a surge voltage occurs between the positive-side input terminal and the negative-side input terminal of the power conversion circuit immediately after the turning-on or turning-off of the switching-element transistors constituting the upper arm and the lower arm. In order to reduce the surge voltage, a snubber capacitor serving as a surge voltage absorbing device is placed between the positive-side input terminal and the negative-side input terminal in Patent Document 1.

RELATED-ART DOCUMENTS

Patent Document

[Patent Document 1] Japanese Patent Application Publication No. 2015-135895
[Patent Document 2] Japanese Patent Application Publication No. 2014-187874

SUMMARY OF THE INVENTION

A semiconductor module according to an aspect of the present disclosures include: (A) a circuit substrate having an insulating substrate as well as a first input interconnect pattern, a second input interconnect pattern, a first control interconnect pattern, and a second control interconnect pattern formed on a surface of the insulating substrate; (B) a first vertical transistor having a first main electrode pad, a second main electrode pad, and a first gate electrode pad, the second main electrode pad and the first gate electrode pad being formed on an opposite side from the first main electrode pad, the first vertical transistor being mounted on the circuit substrate such that the first main electrode pad faces the first input interconnect pattern to be electrically connected to the first input interconnect pattern, the first gate electrode pad being electrically coupled to the first control interconnect pattern; (C) a second vertical transistor having a third main electrode pad, a fourth main electrode pad, and a second gate electrode pad, the fourth main electrode pad and the second gate electrode pad being formed on an opposite side from the third main electrode pad, the second vertical transistor being mounted on the circuit substrate such that the fourth main electrode pad faces the second input interconnect pattern to be electrically connected to the second input interconnect pattern, the second gate electrode pad facing the second control interconnect pattern to be electrically connected to the second control interconnect pattern; (D) a surge voltage absorbing device connecting the first input interconnect pattern and the second input interconnect pattern, and configured to absorb surge voltage; and (E) a plate member disposed on the first vertical transistor and the second vertical transistor, and having a back-side conductive area, wherein the second main electrode pad and the third main electrode pad are electrically coupled to each other through the back-side conductive area of the plate member.

MODE FOR CARRYING OUT THE INVENTION

Figure 1:
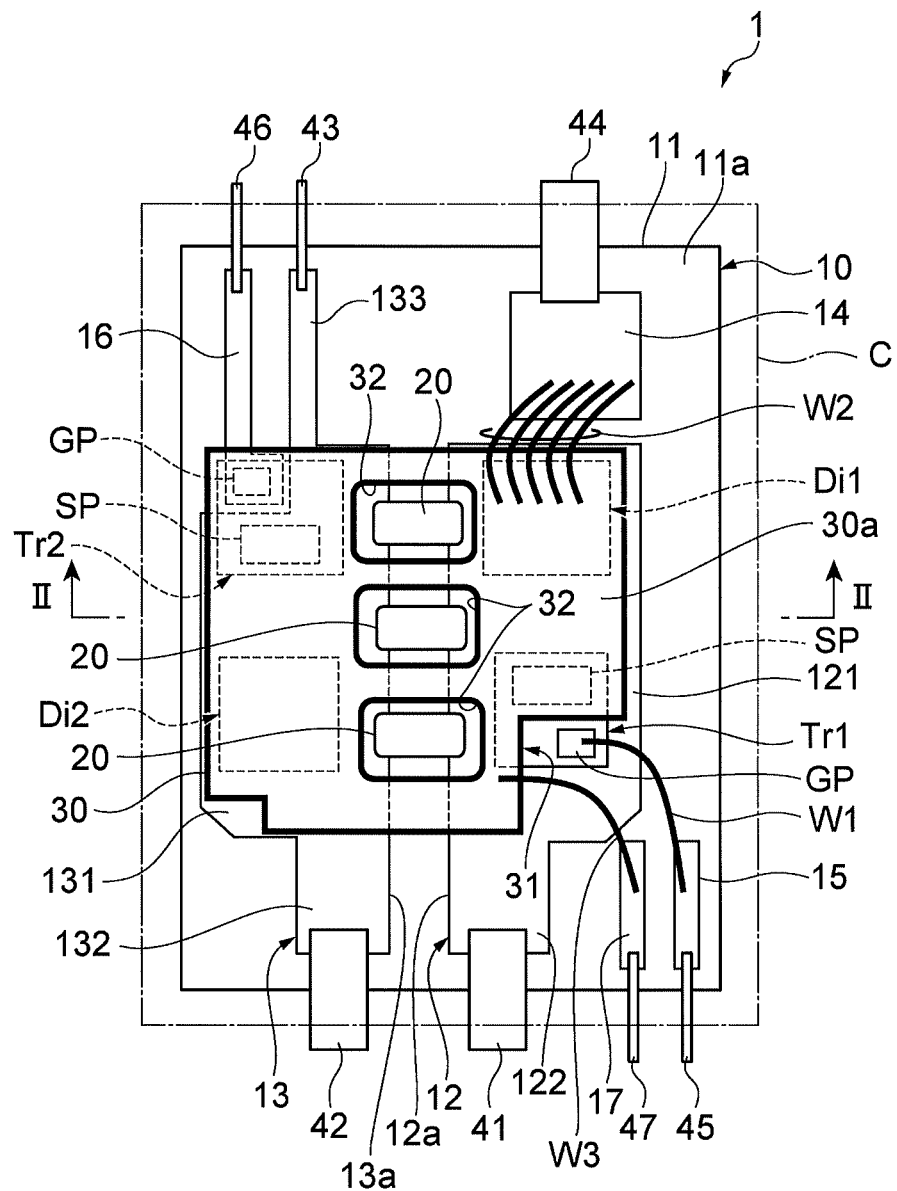
FIG. 1 is a plan view illustrating a schematic configuration of a semiconductor module according to an embodiment.

In the technology disclosed in Patent Document 1, the part on which the transistors are mounted and the part on which the snubber capacitor is mounted are formed separately on the substrate on which the switching-element transistors or the like are mounted, thereby thermally separating these parts from each other, in order to prevent degradation caused by heat from the snubber capacitor (i.e., surge voltage absorbing device). In such a case, the distance between the transistors and the snubber capacitor tends to be elongated, which may result in the failure to sufficiently reduce surge voltage.

Accordingly, one of the objects of the present disclosures is to provide a semiconductor module that is capable of reducing surge voltage more reliably.

In the following, embodiments of the technology of the present disclosure will be described with reference to the accompanying drawings. In the description of the drawings, the same elements are referred to by the same numerals, and a duplicate description will be omitted.

Description of Embodiments

In the following, embodiments of the disclosed technology will be listed and described.

A semiconductor module according to an aspect of the present disclosure include: (A) a circuit substrate having an insulating substrate as well as a first input interconnect pattern, a second input interconnect pattern, a first control interconnect pattern, and a second control interconnect pattern formed on a surface of the insulating substrate; (B) a first vertical transistor having a first main electrode pad, a second main electrode pad, and a first gate electrode pad, the second main electrode pad and the first gate electrode pad being formed on an opposite side from the first main electrode pad, the first vertical transistor being mounted on the circuit substrate such that the first main electrode pad faces the first input interconnect pattern to be electrically connected to the first input interconnect pattern, the first gate electrode pad being electrically coupled to the first control interconnect pattern; (C) a second vertical transistor having a third main electrode pad, a fourth main electrode pad, and a second gate electrode pad, the fourth main electrode pad and the second gate electrode pad being formed on an opposite side from the third main electrode pad, the second vertical transistor being mounted on the circuit substrate such that the fourth main electrode pad faces the second input interconnect pattern to be electrically connected to the second input interconnect pattern, the second gate electrode pad facing the second control interconnect pattern to be electrically connected to the second control interconnect pattern; (D) a surge voltage absorbing device connecting the first input interconnect pattern and the second input interconnect pattern, and configured to absorb surge voltage; and (E) a plate member disposed on the first vertical transistor and the second vertical transistor, and having a back-side conductive area, wherein the second main electrode pad and the third main electrode pad are electrically coupled to each other through the back-side conductive area of the plate member.

In the above-noted configuration, the second main electrode pad of the first vertical transistor and the third main electrode pad of the second vertical transistor are electrically coupled to each other through the back-side conductive area of the plate member, so that the first vertical transistor and the second vertical transistor are connected in series. The first main electrode pad of the first vertical transistor is electrically coupled to the first input interconnect pattern, and the fourth main electrode pad of the second vertical transistor is coupled to the second input interconnect pattern. In the circuit comprised of the first vertical transistor and the second vertical transistor connected in series, a positive voltage is applied to the first vertical transistor through the first input interconnect pattern, and a negative voltage is applied to the second vertical transistor through the second input interconnect pattern. With the positive voltage being applied to the first vertical transistor and the negative voltage being applied to the second vertical transistor, control signals are applied to the first gate electrode pad of the first vertical transistor and to the second gate electrode pad of the second vertical transistor through the first control interconnect pattern and the second control interconnect pattern, respectively. The semiconductor module thus serves as a power conversion circuit. The semiconductor module is configured such that the first input interconnect pattern and the second input interconnect pattern are coupled to each other through the surge voltage absorbing device, which is thus able to absorb surge voltage occurring during the operation of the semiconductor module. The first vertical transistor is mounted on the circuit substrate such that the first main electrode pad faces the first input interconnect pattern to be electrically connected to the first input interconnect pattern, and such that the fourth main electrode pad faces the second input interconnect pattern to be electrically connected to the second input interconnect pattern. With this configuration, the current path from the first vertical transistor and the second vertical transistor to the surge voltage absorbing device is reduced, which serves to reduce inductance. As a result, surge voltage occurring during the operation of the semiconductor module is more reliably reduced.

The plate member may have a notch, and the plate member may be disposed on the first vertical transistor to expose the first gate electrode pad through the notch. With this arrangement, the first gate electrode pad of the first vertical transistor and the first control interconnect pattern are readily coupled to each other even when the plate member is disposed on the opposite side of the first vertical transistor and the second vertical transistor from the circuit substrate.

The plate member may have a through hole that penetrates through the plate member, and the surge voltage absorbing device may be disposed inside the through hole. With this arrangement, interference between the surge voltage absorbing device and the plate member is prevented.

A first transistor mount area of the first input interconnect pattern, having the first vertical transistor mounted thereon, may be situated opposite a second transistor mount area of the second input interconnect pattern, having the second vertical transistor mounted thereon, and an edge of the first transistor mount area and an edge of the second transistor mount area that face each other may be parallel to each other, with the surge voltage absorbing device connecting the edge of the first transistor mount area and the edge of the second transistor mount area that face each other.

With this configuration, the surge voltage absorbing device may be disposed between the first vertical transistor and the second vertical transistor in the direction perpendicular to the direction in which the edges extend. The current path from the first vertical transistor and the second vertical transistor to the surge voltage absorbing device is thus further shortened. As a result, surge voltage occurring at the time of operation of the semiconductor module is more efficiently reduced.

The circuit substrate may have an output interconnect pattern on the insulating substrate, and the output interconnect pattern may be electrically coupled to the back-side conductive area of the plate member. In this case, the output voltage is transmitted to the outside through the output interconnect pattern.

A semiconductor module according to a further aspect of the present disclosures include: a circuit substrate having a first input interconnect pattern and a second input interconnect pattern on an upper surface thereof; a plate member disposed over the circuit substrate and having a back-side conductive area on a lower surface thereof that faces the circuit substrate; a first vertical transistor having a first main electrode pad on a lower face thereof, and having a second main electrode pad and a first gate electrode pad on an upper face thereof, the first vertical transistor being interposed between the circuit substrate and the plate member such that the first main electrode pad is electrically connected to the first input interconnect pattern and such that the second main electrode pad is electrically connected to the back-side conductive area; a second vertical transistor having a third main electrode pad on an upper face thereof, and having a fourth main electrode pad and a second gate electrode pad on a lower face thereof, the second vertical transistor being interposed between the circuit substrate and the plate member such that the fourth main electrode pad is electrically connected to the second input interconnect pattern and such that the third main electrode pad is electrically connected to the back-side conductive area; a capacitive device connecting the first input interconnect pattern and the second input interconnect pattern; a first control terminal electrically coupled to the first gate electrode pad; a second control terminal electrically coupled to the second gate electrode pad; and an output terminal electrically coupled to the back-side conductive area.

The semiconductor module noted above is configured such that the first input interconnect pattern and the second input interconnect pattern are coupled to each other through the capacitive device, which is thus able to absorb surge voltage occurring at the time of the operation of the semiconductor module. The first vertical transistor is interposed between the circuit substrate and the plate member such that the first main electrode is electribally coupled to the first input interconnect pattern, and the second vertical transistor is interposed between the circuit substrate and the plate member such that the fourth main electrode pad is electrically coupled to the second input interconnect pattern. With this configuration, the current path from the first vertical transistor and the second vertical transistor to the capacitive device is shortened, thereby reducing inductance. As a result, surge voltage occurring at the time of operation of the semiconductor module is more reliably reduced.

Details of Embodiments

In the following, specific examples of the embodiments of the disclosed technology will be described with reference to the drawings. The present invention is not limited to those examples, and is intended to be defined by the scope of the claims and to include any variations and modifications falling within the scope warranted for equivalents of the scope of the claims. In the description of the drawings, the same elements are referred to by the same numerals, and a duplicate description will be omitted.

Figure 2:
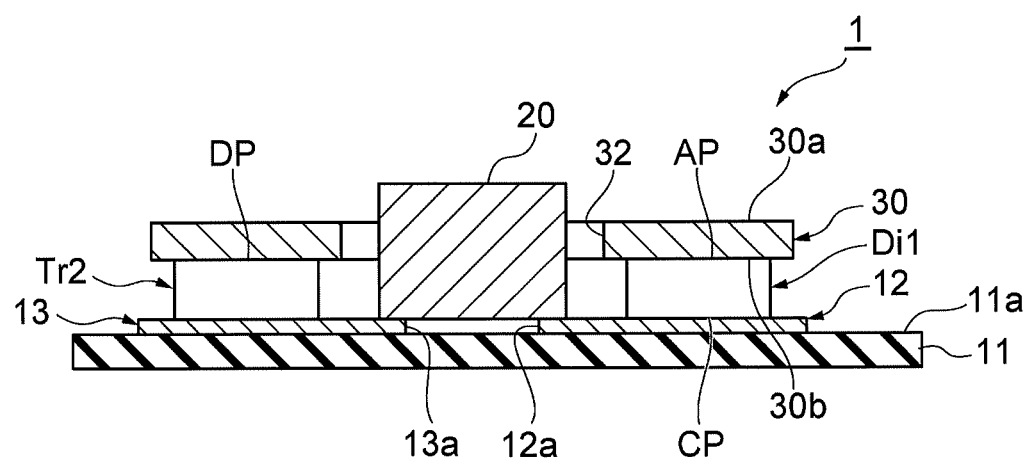
FIG. 2 is a schematic drawing illustrating a main configuration on the circuit substrate when the cross-section along the line II-II in FIG. 1 is viewed in the direction indicated by the arrows.

A semiconductor module 1 illustrated in FIG. 1 and FIG. 2 serves as a power conversion apparatus such as an inverter device. A semiconductor module 1 includes a circuit substrate 10, a first transistor Tr1, a second transistor Tr2, at least one surge voltage absorbing device 20, a conductive plate (plate member) 30. FIG. 2 is a schematic drawing illustrating a main configuration on the circuit substrate when the cross-section along the line II-II in FIG. 1 is viewed in the direction indicated by the arrows. In FIG. 2, a second wire W2, a case C, etc. illustrated in FIG. 1 are omitted.

The semiconductor module 1 may include a first diode Di1 and a second diode Di2. The semiconductor module 1 may further include the case C in which the circuit substrate 10 as well as the first transistor Tr1, the second transistor Tr2, and the like mounted on the circuit substrate 10 are stored.

In FIG. 1, the case C is schematically illustrated in dash-and-dot lines. The case C may be made of a resin, for example. The case C may include a bottom plate and a resin cover that covers the circuit substrate 10 and the like, such that the bottom plate is implemented as a heatsink plate on which the circuit substrate 10 is mounted. The structure stored in the case C on the circuit substrate 10 (e.g., the first transistor Tr1, the second transistor Tr2, etc.) may be encapsulated in a silicone gel, for example.

In the following, a configuration in which the semiconductor module 1 includes the first diode Di1, the second diode Di2, and the case C, and also includes three surge voltage absorbing devices 20, unless stated otherwise, will be described.

Figure 3:
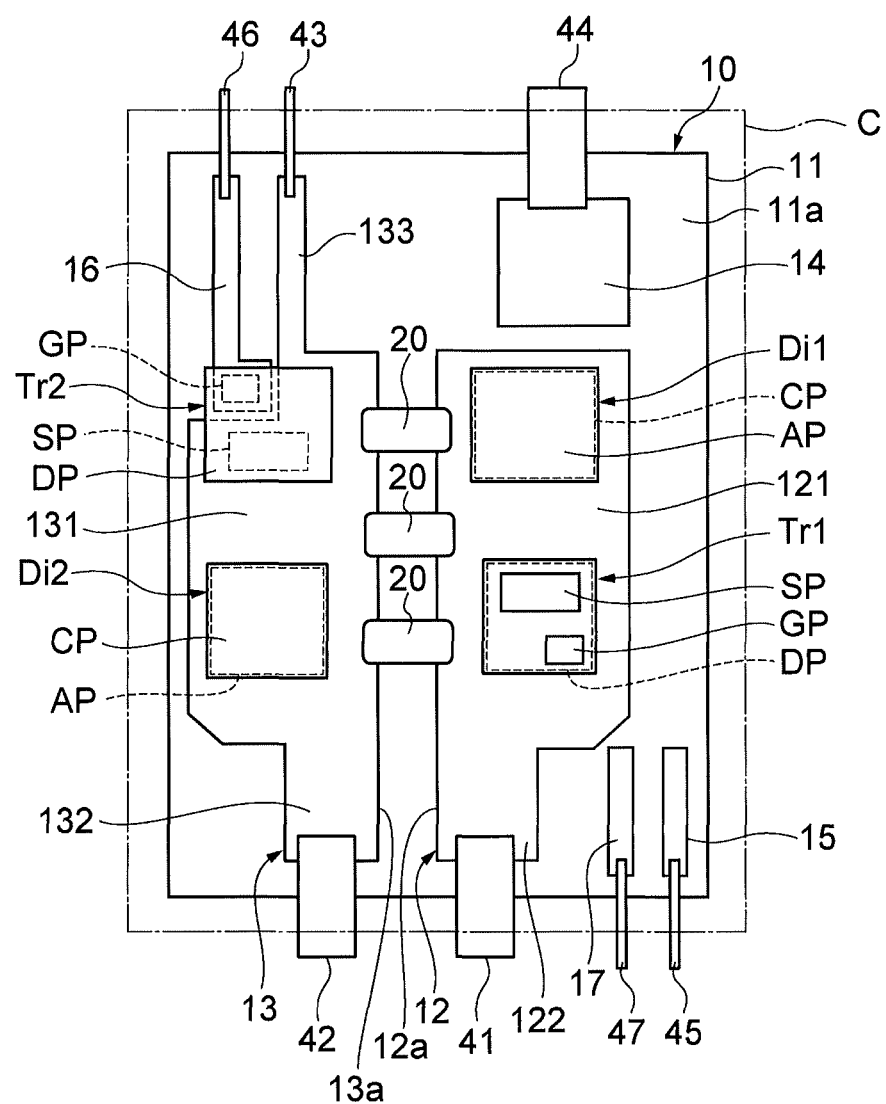
FIG. 3 is a schematic drawing illustrating the configuration on the circuit substrate that appears upon removing the conductive plate from the semiconductor module illustrated in FIG. 1.

FIG. 3 is a schematic drawing illustrating the configuration on the circuit substrate that appears upon removing the conductive plate from the semiconductor module illustrated in FIG. 1. As illustrated in FIG. 1 and FIG. 3, the circuit substrate 10 includes an insulating substrate 11. A P pad 12, an N pad 13, an O pad 14, a first control signal pad 15, and a second control signal pad 16 are formed on a surface 11a of the insulating substrate 11. An auxiliary pad 17 may also be formed on the surface 11a. The configuration in which the auxiliary pad 17 is formed will be described unless stated otherwise.

The insulating substrate 11 may be a ceramic substrate, for example. Examples of the material of the insulating substrate 11 include AlN, SiN, and $Al_2O_3$. The shape of the insulating substrate 11, as viewed in the thickness direction (i.e., the plan shape as viewed from above, for example) is not limited, and may be a rectangle or a square, for example. The back face of the insulating substrate 11 (which is opposite the face on which the first transistor Tr1 and the second transistor Tr2 are mounted) may have a heatsink layer formed thereon made of copper or the like.

The P pad (first input interconnect pattern) 12, which is made of copper, for example, is a conductive layer having a first transistor mount area 121 and an outside connection area 122. The first transistor mount area 121 is an area on which the first transistor Tr1 is mounted. The first diode Di1 is also mounted on the first transistor mount area 121. The outside connection area 122 is an area that continues seamlessly from the first transistor mount area 121 and to which one end of the positive-electrode terminal 41 is coupled. The other end of the positive-electrode terminal 41 extends to the outside of the case C.

The N pad (second input interconnect pattern) 13, which is made of copper, for example, is a conductive layer having a second transistor mount area 131, a first outside connection area 132, and a second outside connection area 133. The second transistor mount area 131 is an area on which the second transistor Tr2 is mounted. The second diode Di2 is also mounted on the second transistor mount area 131. The first outside connection area 132 is an area that continues seamlessly from the second transistor mount area 131 and to which one end of the negative-electrode terminal 42 is coupled. The second outside connection area 133 is an area that continues seamlessly from the second transistor mount area 131 and to which one end of the second auxiliary terminal 43 is coupled. In the present embodiment, the second outside connection area 133 is disposed on the opposite side of the second transistor mount area 131 from the first outside connection area 132. The other ends of the negative-electrode terminal 42 and the second auxiliary terminal 43 extend to the outside of the case C.

The N pad 13 is disposed opposite the P pad 12. Specifically, the N pad 13 is disposed such that an edge (opposite edge) 13a of the N pad 13 is situated alongside and in parallel to an edge (opposite edge) 12a of the P pad 12.

The O pad (output interconnect pattern) 14, which is made of copper, for example, is a conductive layer to which one end of the output terminal 44 is coupled. In the present embodiment, the O pad 14 is formed separately from the P pad 12 on the opposite side of the first transistor mount area 121 from the outside connection area 122, and is disposed alongside the second outside connection area 133. The other end of the output terminal 44 extends to the outside of the case C.

The first control signal pad (first control interconnect pattern) 15, which is made of copper, for example, is a conductive layer to which one end of the first control terminal 45 is coupled. In the present embodiment, the first control signal pad 15 is disposed on one side of the outside connection area 122. The other end of the first control terminal 45 extends to the outside of the case C.

The second control signal pad (second control interconnect pattern) 16, which is made of copper, for example, is a conductive layer to which one end of the second control terminal 46 is coupled. In the present embodiment, the second control signal pad 16 is disposed alongside the second outside connection area 133 on the opposite side of the second outside connection area 133 from the O pad 14. The other end of the second control terminal 46 extends to the outside of the case C.

An auxiliary pad 17, which is made of copper, for example, is a conductive layer to which one end of the first auxiliary terminal 47 is coupled. In the present embodiment, the auxiliary pad 17 is disposed between the first control signal pad 15 and the outside connection area 122. The other end of the first auxiliary terminal 47 extends to the outside of the case C.

The shape and arrangement of the above-noted pads (i.e., the P pad 12, the N pad 13, the O pad 14, etc.) formed on the surface 11a of the insulating substrate 11 are not limited to those illustrated in FIG. 1 and FIG. 3, and may be configured as appropriate by taking into account the ease of mounting, and the ease of interconnecting, the first transistor Tr1, the second transistor Tr2, the first diode Di1, the second diode Di2, and the like.

The first transistor Tr1 and the second transistor Tr2 are vertical transistors which may be implemented as chips. Examples of the material of the first transistor Tr1 and the second transistor Tr2 include Si and a wide bandgap semiconductor such as SiC and GaN. The first transistor Tr1 and the second transistor Tr2 may be MOSFETs (i.e., metal-oxide-semiconductor field-effect transistors), or may be insulated-gate bipolar transistors (i.e., IGBTs). In the following, the first transistor Tr1 and the second transistor Tr2 are MOSFETs having an identical configuration unless stated otherwise.

The first transistor Tr1 has a source electrode pad SP, a gate electrode pad GP, and a drain electrode pad DP. The source electrode pad SP and the gate electrode pad GP are disposed on the opposite face of the first transistor Tr1 from the drain electrode pad DP in the thickness direction of the first transistor Tr1 (i.e., the thickness direction of the insulating substrate 11). For the sake of illustration, the drain electrode pad DP facing the first transistor mount area 121 is illustrated with dashed lines situated slightly inside the outline of the first transistor Tr1. Nonetheless, the drain electrode pad DP may be formed on the entire surface of the first transistor Tr1 opposite from the source electrode pad SP and the gate electrode pad GP. With respect to the first transistor Tr1, a conductive state between the source electrode pad SP and the drain electrode pad DP is controlled in response to a control signal applied to the gate electrode pad GP. With this arrangement, the first transistor Tr1 serves as a switching element.

In the present embodiment, the drain electrode pad DP, the source electrode pad SP, and the gate electrode pad GP of the first transistor Tr1 correspond to a first main electrode pad, a second main electrode pad, and a first gate electrode pad, respectively, of the first transistor Tr1.

The first transistor Tr1 is mounted on the circuit substrate 10 such that the drain electrode pad DP faces the first transistor mount area 121 of the P pad 12 and is electrically connected to the first transistor mount area 121. The drain electrode pad DP may be fixedly attached to the first transistor mount area 121 with solder or a sintered material, for example. In this arrangement, the source electrode pad SP and the gate electrode pad GP of the first transistor Tr1 are disposed on the opposite face of the first transistor Tr1 from the circuit substrate 10. The gate electrode pad GP of the first transistor Tr1 is coupled to the first control signal pad 15 through a first conductive line (i.e., first connection part) W1. The first conductive line W1 may be a wire or a ribbon, for example.

With the drain electrode pad DP of the first transistor Tr1 being electrically connected to the P pad 12, a positive voltage may be applied to the drain electrode pad DP of the first transistor Tr1 through the positive-electrode terminal 41. With the gate electrode pad GP of the first transistor Tr1 being electrically coupled to the first control signal pad 15 through the first conductive line W1, a control signal may be applied to the first transistor Tr1 through the first control terminal 45.

The second transistor Tr2 has a source electrode pad SP, a gate electrode pad GP, and a drain electrode pad DP. The source electrode pad SP and the gate electrode pad GP are disposed on the opposite face of the second transistor Tr2 from the drain electrode pad DP in the thickness direction of the second transistor Tr2 (i.e., the thickness direction of the insulating substrate 11). With respect to the second transistor Tr2, a conductive state between the source electrode pad SP and the drain electrode pad DP is controlled in response to a control signal applied to the gate electrode pad GP. With this arrangement, the second transistor Tr2 serves as a switching element.

In the present embodiment, the drain electrode pad DP, the source electrode pad SP, and the gate electrode pad GP of the second transistor Tr2 correspond to a third main electrode pad, a fourth main electrode pad, and a second gate electrode pad, respectively, of the second transistor Tr2.

The second transistor Tr2 is mounted on the circuit substrate 10 such that the source electrode pad SP and the gate electrode pad GP face the circuit substrate 10. Specifically, the second transistor Tr2 is mounted on the circuit substrate 10 such that the source electrode pad SP faces the second transistor mount area 131 of the N pad 13 and is electrically connected to the second transistor mount area 131, and such that the gate electrode pad GP of the second transistor Tr2 faces the second control signal pad 16 and is electrically connected to the second control signal pad 16. The source electrode pad SP and the gate electrode pad GP of the second transistor Tr2 may be fixedly attached to the second transistor mount area 131 and to the second control signal pad 16, respectively, with solder or a sintered material, for example. With the second transistor Tr2 mounted in such a position, the drain electrode pad DP is situated on the opposite face of the second transistor Tr2 from the circuit substrate 10.

With the source electrode pad SP of the second transistor Tr2 being electrically coupled to the N pad 13, a negative voltage may be applied to the source electrode pad SP of the second transistor Tr2 through the negative-electrode terminal 42, and the potential of the source electrode pad SP of the second transistor Tr2 may be transmitted to the outside of the semiconductor module 1 through the second auxiliary terminal 43. The potential of the source electrode pad SP of the second transistor Tr2 transmitted through the second auxiliary terminal 43 may be utilized to generate the control signal for the second transistor Tr2, for example. With the gate electrode pad GP of the second transistor Tr2 being electrically coupled to the second control signal pad 16, a control signal may be applied to the second transistor Tr2 through the second control terminal 46.

The first diode Di1 and the second diode Di2 are freewheeling diodes for the first transistor Tr1 and the second transistor Tr2, respectively. The first diode Di1 and the second diode Di2 have an identical configuration.

The first diode Di1 is mounted on the circuit substrate 10 such that a cathode CP faces the first transistor mount area 121 and is electrically connected to the first transistor mount area 121. In FIG. 3, for the sake of convenience of illustration, the cathode CP facing the first transistor mount area 121 is illustrated with dashed lines situated slightly inside the outline of the first diode Di1. Notwithstanding this, the cathode CP may be formed on the entire face of the first diode Di1 opposite from an anode AP. The cathode CP of the first diode Di1 may be fixedly attached to the first transistor mount area 121 with solder, a sintered material, or the like, for example. With this arrangement, the cathode CP of the first diode Di1 and the drain electrode pad DP of the first transistor Tr1 are electrically coupled to each other through the first transistor mount area 121, so that the positive voltage supplied through the positive-electrode terminal 41 may also be applied to the cathode CP of the first diode Di1. In the configuration noted above, the anode AP of the first diode Di1 is situated on the opposite face of the first diode Di1 from the circuit substrate 10.

The second diode Di2 is mounted on the circuit substrate 10 such that an anode AP faces the second transistor mount area 131 and is electrically connected to the second transistor mount area 131. In FIG. 3, for the sake of convenience of illustration, the anode AP facing the second transistor mount area 131 is illustrated in dashed lines situated slightly inside the outline of the second diode Di2. Notwithstanding this, the anode AP may be formed on the entire face of the second diode Di2 opposite from a cathode CP. The anode AP of the second diode Di2 may be fixedly attached to the second transistor mount area 131 with solder, a sintered material, or the like, for example. With this arrangement, the anode AP of the second diode Di2 and he source electrode pad SP of the second transistor Tr2 are electrically coupled to each other through the second transistor mount area 131, so that the negative voltage supplied to the second transistor Tr2 through the negative-electrode terminal 42 may also be applied to the anode AP of the second diode Di2. In the configuration noted above, the cathode CP of the second diode Di2 is situated on the opposite face of the second diode Di2 from the circuit substrate 10.

The surge voltage absorbing devices 20 are elements for absorbing surge voltage. An example of the surge voltage absorbing devices 20 is a capacitor. An example of the capacitor is a ceramic capacitor. It suffices for the capacitor for surge absorbing purposes to have a sufficient capacitance for absorbing an expected surge voltage.

As illustrated in FIG. 1 through FIG. 3, the surge voltage absorbing devices 20 provide connections between the edge 12a of the P pad 12 and the edge 13a of the N pad 13. Specifically, one end of each of the surge voltage absorbing devices 20 is connected to a portion of the edge 12a at the position of the first transistor mount area 121, and the other end thereof is connected to a portion of the edge 13a at the position of the second transistor mount area 131. The surge voltage absorbing devices 20 are spaced apart from each other along the extension of the edge 12a (and the edge 13a).

The conductive plate 30 is disposed on the first transistor Tr1, the first diode Di1, the second transistor Tr2, and the second diode Di2 such that the first transistor Tr1, the first diode Di1, the second transistor Tr2, and the second diode Di2 are sandwiched between the circuit substrate 10 and the conductive plate 30. It suffices for the conductive plate 30 to be a plate member made of a conductive material, such as a metal plate, for example. The material of the conductive plate 30 may be copper or aluminum, for example. The thickness of the conductive plate 30 may approximately be 0.3 millimeters, for example. Due to the use of a conductive material for the conductive plate 30, a front surface 30a of the conductive plate 30 is a conductive area (i.e., front-side conductive area), and a back surface 30b is also a conductive area (i.e., back-side conductive area). The front surface 30a and the back surface 30b, which are conductive areas, are electrically coupled to each other.

As illustrated in FIG. 1, the conductive plate 30 is substantially rectangular or square-shaped as viewed in the thickness direction (i.e., in a plan view), and has a notch 31 at the position directly above the gate electrode pad GP of the first transistor Tr1. The conductive plate 30 is disposed on the first transistor Tr1, the first diode Di1, the second transistor Tr2, and the second diode Di2, such that the gate electrode pad GP of the first transistor Tr1 is exposed through the notch 31. The conductive plate 30 is electrically connected to the source electrode pad SP of the first transistor Tr1, the anode AP of the first diode Di1, the drain electrode pad DP of the second transistor Tr2, and the cathode CP of the second diode Di2 with solder, a sintered material, or the like, for example. In other words, the source electrode pad SP of the first transistor Tr1, the anode AP of the first diode Di1, the drain electrode pad DP of the second transistor Tr2, and the cathode CP of the second diode Di2 are electrically coupled to each other through the conductive plate 30.

The conductive plate 30 has through holes 32 at the positions of the surge voltage absorbing devices 20. The through holes 32 are provided for the purpose of accommodating the surge voltage absorbing devices 20, and may be of such size as to prevent the surge voltage absorbing devices 20 from coming in contact with the through holes 32. With this arrangement, the conductive plate 30 and the surge voltage absorbing devices 20 are reliably prevented from interfering with each other even when the conductive plate 30 and the circuit substrate 10 are disposed to face each other.

The conductive plate 30 is coupled to the O pad 14 through second conductive lines W2. The second conductive lines W2 may be wires or ribbons, for example. A large current may flow between the conductive plate 30 and the O pad 14, so that a plurality of wires may be used to connect the conductive plate 30 and the O pad 14 when the second conductive lines W2 are implemented as wires. The conductive plate 30 is coupled to the auxiliary pad 17 through a third conductive line W3. The third conductive line W3 may be a wire or a ribbon, for example.

Figure 4:
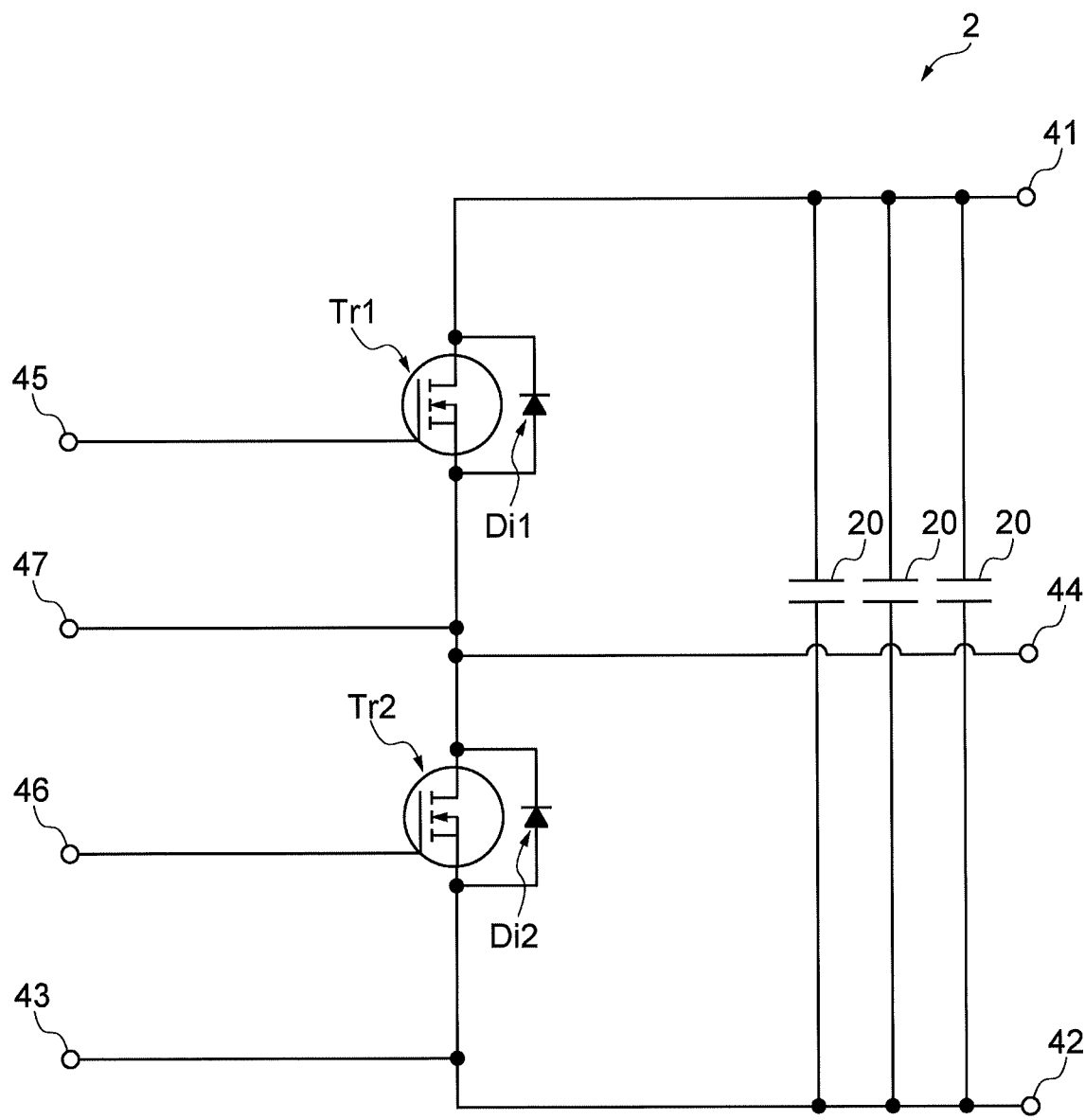
FIG. 4 is a drawing illustrating an equivalent circuit of the semiconductor module illustrated in FIG. 1.

In the configuration noted above, the first transistor Tr1 and the first diode Di1 are electrically coupled in reverse parallel connection, and the second transistor Tr2 and the second diode Di2 are electrically coupled in reverse parallel connection, with the first transistor Tr1 and the second transistor Tr2 being electrically connected in series. With this configuration, the semiconductor module 1 serves as a power conversion circuit 2 as does an equivalent circuit of the semiconductor module 1 illustrated in FIG. 4. The power conversion circuit 2 illustrated in FIG. 4 is a single-phase inverter circuit. In this case, the semiconductor module 1 is a semiconductor module of a 2-in-1 type, for example. In FIG. 4, those circuit elements corresponding to the elements of the semiconductor module 1 are referred to by the same reference characters. The first transistor Tr1 and the second transistor Tr2 of the semiconductor module 1 constitute the upper arm and the lower arm, respectively, of the power conversion circuit 2.

The conductive plate 30 is coupled to the O pad 14 through the second conductive lines W2, so that the output voltage of the power conversion circuit 2 may be transmitted to the outside of the semiconductor module 1 through the output terminal 44. The conductive plate 30 is coupled to the auxiliary pad 17 through the third conductive line W3, so that the potential of the source electrode pad SP of the first transistor Tr1 may be transmitted to the outside of the semiconductor module 1 through the first auxiliary terminal 47. The potential of the source electrode pad SP of the first transistor Tr1 transmitted through the first auxiliary terminal 47 may be utilized to generate the control signal for the first transistor Tr1, for example.

In the semiconductor module 1, the drain electrode pad DP of the first transistor Tr1 is electrically coupled to the P pad 12, and the source electrode pad SP of the second transistor Tr2 is electrically coupled to the N pad 13. Accordingly, the positive-electrode terminal 41 and the negative-electrode terminal 42 may be used to supply power to the first transistor Tr1 and the second transistor Tr2 which are electrically connected in series between the positive-electrode terminal 41 and the negative-electrode terminal 42.

Moreover, the gate electrode pad GP of the first transistor Tr1 and the gate electrode pad GP of the second transistor Tr2 are electrically coupled to the first control terminal 45 and the second control terminal 46, respectively. Accordingly, the control signals may be applied to the first transistor Tr1 and the second transistor Tr2 through the first control terminal 45 and the second control terminal 46, respectively.

In this manner, the first transistor Tr1 and the second transistor Tr2 in the semiconductor module 1 may be alternately turned on/off, thereby converting a direct-current voltage applied between the positive-electrode terminal 41 and the negative-electrode terminal 42 into an alternating-current voltage, and then outputting the alternating-current voltage from the output terminal 44.

In the power conversion circuit 2 including the first transistors Tr1 and the second transistors Tr2 connected in series between the positive-electrode terminal 41 and the negative-electrode terminal 42, surge voltage occurs when the first transistor Tr1 and the second transistor Tr2 are turned on or off.

In the semiconductor module 1, the first transistor mount area 121 of the P pad 12 and the second transistor mount area 131 of the N pad 13 are connected to each other through the surge voltage absorbing devices 20. Accordingly, as illustrated in FIG. 4, the surge voltage absorbing devices 20 are electrically connected in parallel to the first transistor Tr1 and the second transistor Tr2, which are electrically connected in series between the positive-electrode terminal 41 and the negative-electrode terminal 42. With this configuration of the semiconductor module 1, the surge voltage absorbing devices 20 serve to absorb the surge voltage.

The size of surge voltage is calculated as L×di/dt in which the current is denoted as i, and the inductance is denoted as L. The inductance that controls the size of surge voltage includes the interconnect inductance of the path through which the current i flows. Further, di/dt depends on the switching speed of the first transistors Tr1 and the second transistors Tr2. As continuing efforts have been made to increase the speed of switching, there is a tendency for di/dt to increase. Especially when a wide-bandgap semiconductor is used as the material for the first transistors Tr1 and the second transistors Tr2, di/dt tends to increase because the switching speed is faster than in the case of Si. In order to effectively reduce surge voltage, therefore, it is important to reduce the effect of interconnect inductance included in the inductance L inside the case C by placing the surge voltage absorbing devices 20 in close physical proximity (in terms of the length of electrical connections) to the first transistors Tr1 and to the second transistors Tr2.

The arrangement of the second transistor Tr2 on the circuit substrate 10 may be such that the second transistor Tr2 is mounted on the circuit substrate 10, with the drain electrode pad DP facing the circuit substrate 10, as disclosed in Patent Document 1, for example. In such a mounting arrangement, connecting the P pad 12 and the N pad through the surge voltage absorbing devices 20 for the purpose of absorbing surge voltage requires mounting the second transistor Tr2 on the O pad 14 and coupling the second transistor Tr2 to the N pad 13 through conductive lines. With this arrangement, the current paths (i.e., electrical line) between the surge voltage absorbing devices 20 and the second transistor Tr2 end up having an increased length.

In the semiconductor module 1, the second transistor Tr2 for the lower arm is mounted on the circuit substrate 10 in a vertically reversed position with respect to the first transistor Tr1 for the upper arm. With this arrangement, the first transistor Tr1 is mounted on the P pad 12, and the second transistor Tr2 is mounted on the N pad 13, with the drain electrode pad DP of the second transistor Tr2 and the source electrode pad SP of the first transistor Tr1 being electrically coupled to each other through the conductive plate 30, thereby electrically connecting the first transistor Tr1 and the second transistor Tr2 in series.

With the semiconductor module 1 being in the noted configuration, the first transistor Tr1 and the second transistor Tr2 are mounted on the P pad 12 and the N pad 13, respectively, which are coupled through the surge voltage absorbing devices 20. As a result, the first transistor Tr1 and the second transistor Tr2 may be situated close to the surge voltage absorbing devices 20, so that the interconnect inductance of the current path between the surge voltage absorbing devices 20 and each of the first transistor Tr1 and the second transistor Tr2 can be reduced. Surge voltage is thus efficiently reduced, which stabilizes the voltage applied to the drain electrode pad DP of the first transistor Tr1 and the source electrode pad SP of the second transistor Tr2 in the series-connection circuit comprised of the first transistor Tr1 and the second transistor Tr2.

In the semiconductor module 1, the first transistor Tr1 and the second transistor Tr2 are connected in series through the conductive plate 30, such that the first transistor Tr1 and the second transistor Tr2 are interposed between the conductive plate 30 and the circuit substrate 10. As a result, the degree of freedom in the design increases with respect to the shape and arrangement of pads (e.g., the P pad 12, the N pad 13, the O pad 14, etc.) on the insulating substrate 11.

As illustrated in FIG. 1 and FIG. 3, for example, the P pad 12 and the N pad 13 may be configured such that the first transistor mount area 121 of the P pad 12 and the second transistor mount area 131 of the N pad 13 are placed opposite each other, with the edge 12a and the edge 13a being situated alongside and parallel to each other. In this configuration, the surge voltage absorbing devices 20 are disposed to connect the edge 12a and the edge 13a. Current paths are thus provided by the surge voltage absorbing devices 20 between the first transistor Tr1 and the second transistor Tr2 in the direction perpendicular to the direction in which the edge 12a (or the edge 13b) extends. Current paths between the surge voltage absorbing devices 20 and each of the first transistor Tr1 and the second transistor Tr2 are thus further shortened, which further reduces the effect of inductance. Moreover, the P pad 12 and the N pad 13 are situated close to each other, which reduces the size of the semiconductor module 1.

An increase in the degree of freedom in the design of the P pad 12, the N pad 13, and the O pad 14 on the insulating substrate 11 also increases the degree of freedom in the placement of the O pad 14, for example. Design of the semiconductor module 1 is thus easy.

In the semiconductor module 1, the second transistor Tr2 and the second diode Di2 are mounted on the circuit substrate 10 in a vertically reversed position relative to the first transistor Tr1 and the first diode Di1. A single conductive plate 30 placed to face the circuit substrate 10 can thus provide electrical couplings between the source electrode pad SP of the first transistor Tr1, the anode AP of the first diode Di1, the drain electrode pad DP of the second transistor Tr2, and the cathode CP of the second diode Di2. Accordingly, the semiconductor module 1 in which the surge voltage absorbing devices 20 connect the P pad 12 and the N pad 13 to reduce surge voltage is manufactured in low cost.

The conductive plate 30 has the notch 31 at the position facing the gate electrode pad GP of the first transistor Tr1. Even when the conductive plate 30 is disposed such that the first transistor Tr1 and the second transistor Tr2 are interposed between the conductive plate 30 and the circuit substrate 10, the gate electrode pad GP of the first transistor Tr1 is reliably exposed through the conductive plate 30, which allows the gate electrode pad GP to be readily coupled to the first control signal pad 15 through the first conductive line W1.

The thickness (or height) of the surge voltage absorbing devices 20 is generally greater than the thickness of the first transistor Tr1 and the second transistor Tr2. The conductive plate 30 of the semiconductor module 1 has the through holes for accommodating the surge voltage absorbing devices 20. With this arrangement, placing the surge voltage absorbing devices 20 inside the through holes 32 of the conductive plate 30 serves to prevent the conductive plate 30 from physically interfering with the surge voltage absorbing devices 20 even when the P pad 12 and the N pad 13 are coupled to each other through the surge voltage absorbing devices 20. As a result, the conductive plate 30 is readily placed such that the first transistor Tr1 and the second transistor Tr2 are interposed between the circuit substrate 10 and the conductive plate 30.

Provision of the notch 31 and the through holes 32 allows the conductive plate 30 to be made as a plate member, for example, that covers the first transistor mount area 121 and the second transistor mount area 131 as viewed in the thickness direction thereof (i.e., in the plan view). The conductive plate 30 is thus easily manufactured, which also contributes to the cost reduction in the manufacturing of the semiconductor module 1.

According to the present disclosures, surge voltage is reduced more reliably.

Although the embodiments and variations of the disclosed technology have heretofore been described, the present invention is not limited to these various disclosed embodiments, and various modifications may be made without departing from the scope of the present invention.

For example, capacitors are used as an example of surge voltage absorbing devices. Nonetheless, it suffices for a surge voltage absorbing device to be an element capable of absorbing surge voltage. For example, an RC circuit (or an RC snubber device) made by combining a capacitor and a resistor may be used.

FIG. 1 illustrates the configuration in which one first transistor Tr1 and one second transistor Tr2 are mounted on the P pad and the N pad, respectively. Alternatively, the number of first transistors Tr1 may be plural, and the number of second transistor Tr2 may also be plural.

Figure 5:
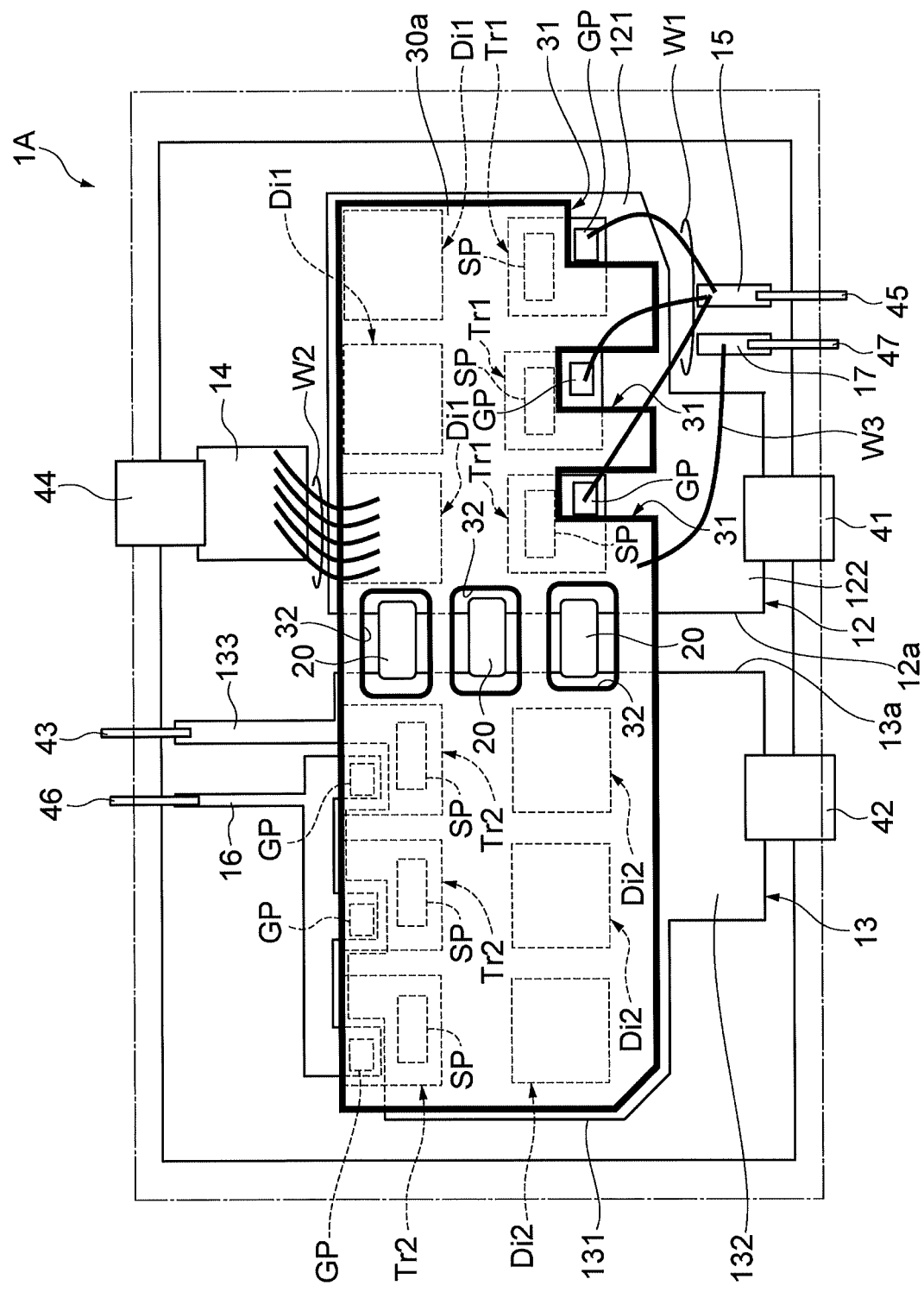
FIG. 5 is a plan view illustrating the schematic configuration of a variation of the semiconductor module.
Figure 6:
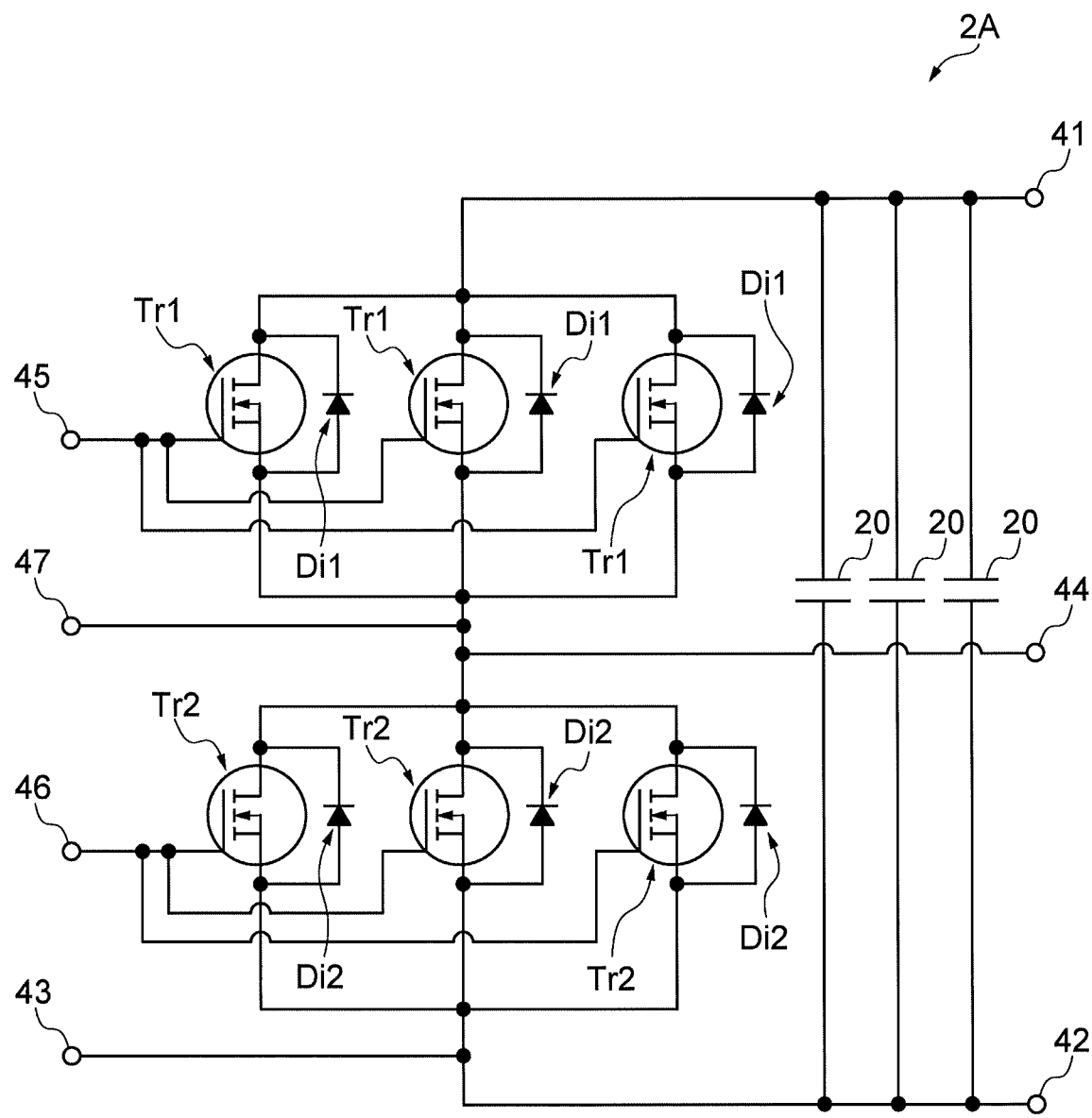
FIG. 6 is a drawing illustrating an equivalent circuit of the semiconductor module illustrated in FIG. 5.

FIG. 5 illustrates an example of a semiconductor module 1 which has three first transistors Tr1 and three second transistors Tr2. FIG. 6 illustrates a power conversion circuit 2A that is an equivalent circuit of the semiconductor module 1A illustrated in FIG. 5. The semiconductor module 1A illustrated in FIG. 5 has three first diodes Di1 in correspondence with the three first transistors Tr1 and three second diodes Di2 in correspondence with the three second transistors Tr2. It may be noted that the number of diodes may be different from the number of transistors.

The manner in which the first transistors Tr1, the first diodes Di1, the second transistors Tr2, and the second diodes Di2 are mounted on the circuit substrate 10 in the semiconductor module 1A is similar to that of the semiconductor module 1.

With the semiconductor module 1A having the three first transistors Tr1, the conductive plate 30 may have notches 31 corresponding to the respective drain electrode pads DP of the first transistors Tr1 so as to expose the drain electrode pads DP of the first transistors Tr1. The second control signal pad 16 and the N pad 13 may be configured such that the coupling between the second control signal pad 16 and the N pad 13 as described in the previous embodiment is realized with respect to each of the three second transistors Tr2.

In the semiconductor module 1A, the plurality of first transistors Tr1 are connected in parallel, and the plurality of second transistors Tr2 are also connected in parallel, as illustrated with respect to the power conversion circuit 2A, which is an equivalent circuit of the semiconductor module 1A. This arrangement enables a large current to flow in the semiconductor module 1A.

The semiconductor module is not limited to the configuration of a single-phase power conversion circuit such as a single-phase inverter circuit, and may be configured as a two or three phase power conversion circuit. The number of transistors and the number of surge voltage absorbing devices as well as the numbers of input terminals (i.e., a positive-voltage terminal and a negative voltage terminal), output terminals, and control terminals, shown as examples, are not limited to those numbers illustrated in the drawings. The semiconductor module may have at least one first transistor and at least one second transistor. Similarly, the semiconductor module may have at least one surge voltage absorbing device.

The arrangement of the first transistor and the second transistor and the interconnection structures between the first transistor, the second transistor, and the various pads (i.e., the P pad, the N pad, the O pad, and the like) are not limited to those shown in the examples, and are preferably optimized in such a manner as to minimize the interconnect inductance for the purpose of reducing surge voltage.

The circuit substrate may not have an output interconnect pattern. In such a case, for example, one end of an output terminal may be directly connected to the conductive plate. Alternatively, an output terminal provided as a seamless extension of the conductive plate may be provided.

An example of the plate member of the semiconductor module is also not limited to a conductive plate. It suffices for a plate member to have a back-side conductive area such that the second main electrode pad of the first vertical transistor and the third main electrode pad of the second vertical transistor, disposed on the circuit substrate, are electrically coupled to each other. For example, the plate member may be configured such that a conductive layer (i.e., back-side conductive area) is formed on the back surface (i.e., the surface facing the circuit substrate) of an insulating substrate. The plate member may be a member having a front-side conductive area that is electrically coupled to the back-side conductive area. For example, the plate member may be configured such that a conductive layer (i.e., back-side conductive area) is formed on the back surface (i.e., the surface facing the circuit substrate) of an insulating substrate, and a conductive member (i.e., front-side conductive area) is formed on the front surface of the insulating substrate, with the conductive layers on the front and back surfaces of the insulating substrate being electrically coupled to each other. With the configuration in which the plate member has the back-side conductive area and the front-side conductive area as noted above, and the circuit substrate has an output interconnect pattern, the front-side conductive area may be electrically coupled to the output interconnect pattern, thereby electrically coupling the back-side conductive area with the output interconnect pattern. With the configuration in which the plate member has the back-side conductive area and the front-side conductive area as noted above, and the circuit substrate has no output interconnect pattern, one end of an output terminal may be directly connected to the front-side conductive area, thereby electrically coupling the back-side conductive area with the output terminal.

DESCRIPTION OF REFERENCE SYMBOLS 1, 1A . . . semiconductor module
10 . . . circuit substrate
11 . . . insulating substrate
12 . . . P pad (first input interconnect pattern)
12a . . . edge (opposite edge)
13 . . . N pad (second input interconnect pattern)
13a . . . edge (opposite edge)
14 . . . O pad (output interconnect pattern)
15 . . . first control signal pad (first control interconnect pattern)
16 . . . second control signal pad (second control interconnect pattern)
20 . . . surge voltage absorbing device
DP . . . drain electrode pad (first main electrode pad, third main electrode pad)
GP . . . gate electrode pad (first gate electrode pad, second gate electrode pad)
SP . . . source electrode pad (second main electrode pad, fourth main electrode pad)
Tr1 . . . first transistor (first vertical transistor)
Tr2 . . . second transistor (second vertical transistor)

The invention claimed is:

1. A semiconductor module, comprising:
a circuit substrate having an insulating substrate as well as a first input interconnect pattern, a second input interconnect pattern, a first control interconnect pattern, and a second control interconnect pattern formed on a surface of the insulating substrate;
a first vertical transistor having a first main electrode pad, a second main electrode pad, and a first gate electrode pad, the second main electrode pad and the first gate electrode pad being formed on an opposite side from the first main electrode pad, the first vertical transistor being mounted on the circuit substrate such that the first main electrode pad faces the first input interconnect pattern to be electrically connected to the first input interconnect pattern, the first gate electrode pad being electrically coupled to the first control interconnect pattern;
a second vertical transistor having a third main electrode pad, a fourth main electrode pad, and a second gate electrode pad, the fourth main electrode pad and the second gate electrode pad being formed on an opposite side from the third main electrode pad, the second vertical transistor being mounted on the circuit substrate such that the fourth main electrode pad faces the second input interconnect pattern to be electrically connected to the second input interconnect pattern, the second gate electrode pad facing the second control interconnect pattern to be electrically connected to the second control interconnect pattern;
a surge voltage absorbing device connecting the first input interconnect pattern and the second input interconnect pattern, and configured to absorb surge voltage; and
a plate member disposed on the first vertical transistor and the second vertical transistor, and having a back-side conductive area,
wherein the second main electrode pad and the third main electrode pad are electrically coupled to each other through the back-side conductive area of the plate member.

2. The semiconductor module as claimed in claim 1, wherein the plate member has a notch, and the plate member is disposed on the first vertical transistor such as to expose the first gate electrode pad through the notch.

3. The semiconductor module as claimed in claim 2, wherein the plate member has a penetrating hole that penetrates through the plate member, and the surge voltage absorbing device is disposed inside the penetrating hole.

4. The semiconductor module as claimed in claim 3, wherein a first transistor mount area of the first input interconnect pattern having the first vertical transistor mounted thereon is situated opposite a second transistor mount area of the second input interconnect pattern having the second vertical transistor mounted thereon,
wherein an edge of the first transistor mount area and an edge of the second transistor mount area that face each other are parallel to each other, and
wherein the surge voltage absorbing device connect the edge of the first transistor mount area and the edge of the second transistor mount area that face each other.

5. The semiconductor module as claimed in claim 4, wherein the circuit substrate has an output interconnect pattern on the insulating substrate, and the output interconnect pattern is electrically coupled to the back-side conductive area of the plate member.

6. The semiconductor module as claimed in claim 3, wherein the circuit substrate has an output interconnect pattern on the insulating substrate, and the output interconnect pattern is electrically coupled to the back-side conductive area of the plate member.

7. The semiconductor module as claimed in claim 2, wherein the circuit substrate has an output interconnect pattern on the insulating substrate, and the output interconnect pattern is electrically coupled to the back-side conductive area of the plate member.

8. The semiconductor module as claimed in claim 2, wherein a first transistor mount area of the first input interconnect pattern having the first vertical transistor mounted thereon is situated opposite a second transistor mount area of the second input interconnect pattern having the second vertical transistor mounted thereon,
wherein an edge of the first transistor mount area and an edge of the second transistor mount area that face each other are parallel to each other, and
wherein the surge voltage absorbing device connect the edge of the first transistor mount area and the edge of the second transistor mount area that face each other.

9. The semiconductor module as claimed in claim 8, wherein the circuit substrate has an output interconnect pattern on the insulating substrate, and the output interconnect pattern is electrically coupled to the back-side conductive area of the plate member.

10. The semiconductor module as claimed in claim 1, wherein the plate member has a penetrating hole that penetrates through the plate member, and the surge voltage absorbing device is disposed inside the penetrating hole.

11. The semiconductor module as claimed in claim 10, wherein a first transistor mount area of the first input interconnect pattern having the first vertical transistor mounted thereon is situated opposite a second transistor mount area of the second input interconnect pattern having the second vertical transistor mounted thereon,
   wherein an edge of the first transistor mount area and an edge of the second transistor mount area that face each other are parallel to each other, and
   wherein the surge voltage absorbing device connect the edge of the first transistor mount area and the edge of the second transistor mount area that face each other.

12. The semiconductor module as claimed in claim 11, wherein the circuit substrate has an output interconnect pattern on the insulating substrate, and the output interconnect pattern is electrically coupled to the back-side conductive area of the plate member.

13. The semiconductor module as claimed in claim 10, wherein the circuit substrate has an output interconnect pattern on the insulating substrate, and the output interconnect pattern is electrically coupled to the back-side conductive area of the plate member.

14. The semiconductor module as claimed in claim 1, wherein a first transistor mount area of the first input interconnect pattern having the first vertical transistor mounted thereon is situated opposite a second transistor mount area of the second input interconnect pattern having the second vertical transistor mounted thereon,
   wherein an edge of the first transistor mount area and an edge of the second transistor mount area that face each other are parallel to each other, and
   wherein the surge voltage absorbing device connect the edge of the first transistor mount area and the edge of the second transistor mount area that face each other.

15. The semiconductor module as claimed in claim 14, wherein the circuit substrate has an output interconnect pattern on the insulating substrate, and the output interconnect pattern is electrically coupled to the back-side conductive area of the plate member.

16. The semiconductor module as claimed in claim 1, wherein the circuit substrate has an output interconnect pattern on the insulating substrate, and the output interconnect pattern is electrically coupled to the back-side conductive area of the plate member.

* * * * *